United States Patent [19]

Tsuhara et al.

[11] Patent Number: 5,726,635
[45] Date of Patent: Mar. 10, 1998

[54] MOUNT-ASSISTING APPARATUS IN ELECTRONIC EQUIPMENT

[75] Inventors: Katsuyoshi Tsuhara, Hakata; Toshie Ohmi, Kawasaki, both of Japan

[73] Assignee: Fujitsu Limited, Kawasaki, Japan

[21] Appl. No.: 463,051

[22] Filed: Jun. 5, 1995

[30] Foreign Application Priority Data

Sep. 6, 1994 [JP] Japan ................... 6-212283

[51] Int. Cl.⁶ .................................................. G08B 21/00
[52] U.S. Cl. .................. 340/635; 340/687; 324/133; 324/758; 361/1; 439/490; 439/955; 200/51.09
[58] Field of Search ........................ 340/635, 687; 324/133, 758; 361/1; 439/490, 955; 200/51.09

[56] References Cited

U.S. PATENT DOCUMENTS

| | | | |
|---|---|---|---|
| 4,507,697 | 3/1985 | Ozil et al. | 340/687 |
| 4,949,035 | 8/1990 | Palmer, II | 340/687 |
| 5,304,987 | 4/1994 | Brunson et al. | 340/654 |
| 5,347,265 | 9/1994 | Shimura | 340/687 |
| 5,521,586 | 5/1996 | Takeshita | 340/687 |

*Primary Examiner*—Jeffrey Hofsass
*Assistant Examiner*—Daniel J. Wu
*Attorney, Agent, or Firm*—Armstrong, Westerman, Hattori, McLeland & Naughton

[57] ABSTRACT

The present invention relates to an apparatus for assisting to mount various detachable packages in electronic equipment which achieves a variety of functions by mounting the packages to a shelf. A first object of the present invention is to provide an assisting apparatus which is configured so that all packages needed for a desired service can surely be mounted and unnecessary packages are not mounted. A plurality of packages cannot achieve a predetermined function if even one of them is not mounted to the shelf. Therefore, when at least one of the plural packages is mounted to the shelf, first display means perform first display to urge the user to mount the remaining packages on the basis of the mounting state when at least one of the plural packages is mounted to the shelf. The first display is performed by, for example, the lighting of a LED. When all of the plural packages are mounted, a predetermined function can be achieved. At this time, second display means performs second display on the basis of the mounting state. The second display is performed by, for example, the extinction of a LED.

6 Claims, 15 Drawing Sheets

| MOUNTING OF SELECTOR | NO. OF PKGs REQUIRING SELECTOR | | SELCHK LINE VOLTAGE | LED OF POW |
|---|---|---|---|---|
| | REQUIRE | NOT REQUIRE | | |
| MOUNTING | 0 | 20 | 5.0 V | EXTINCTION |
| MOUNTING | 1 | 19 | 4.9 V | EXTINCTION |
| ≀ | ≀ | ≀ | ≀ | ≀ |
| MOUNTING | 20 | 0 | 3.1 V | EXTINCTION |
| NOT MOUNTING | 0 | 20 | 5.0 V | EXTINCTION |
| NOT MOUNTING | 1 | 19 | 0.6 V | LIGHTING |
| ≀ | ≀ | ≀ | ≀ | ≀ |
| NOT MOUNTING | 20 | 0 | .03 V | LIGHTING |

MOUNT-ASSISTING APPARATUS IN ELECTRONIC EQUIPMENT

BACKGROUND OF THE INVENTION

1. Field of the Invention

The present invention relates to a mount-assisting apparatus in electronic equipment which achieves a variety of functions by mounting various detachable packages to a shelf and, more particularly, a mount-assisting apparatus in electronic equipment which is used when only some of packages have been mounted on a shelf though a plurality of packages are needed for achieving a predetermined function on a built-in type telephone exchange, personal computer, and the like, or prevents a trouble caused by mounting a package in a slot of a shelf of different power supply system.

2. Description of the Related Art

For example, a telephone exchange comprises an exchange body 101 and a controller 102 as shown in FIG. 13, and the exchange body 101 is substantially made up of a shelf 101a and a plurality of packages (not shown In FIG. 13) mounted thereto.

A functional component of the exchange body 101 is an analog trunk shelf (ATSH) which carries out communications using analog signals. FIG. 14 shows a configuration of the analog trunk shelf, in which various packages are mounted to a shelf 103. The packages include two power source sections (POW) 104 and 105 for generating respective various voltage values to supply them to other packages, common sections (COM) 106 and 107 of redundancy configuration for carrying out communications with an external network, AT sections 111 to 130, which are the main part of the analog trunk shelf, for providing various services, and a selector section (SEL) for carrying out connection control in performing operation test. The portion of the shelf 103 assigned to the AT sections 111 to 130 are configured so that 20 packages can be mounted. These packages achieve various functions such as communication with an exchange of another telephone office (interoffice communication), tripartite conversation, and maintenance service, depending on the type of the package. The AT section for carrying out interoffice communication needs to be subjected to operation tests frequently to prevent a standstill of interoffice communication service from being caused by the trouble of the AT section itself. Therefore, the AT section for carrying out interoffice communication can be connected to the tester via the selector section 131.

FIG. 15 is a view showing a connection of the AT section via the selector section 131 in the case where an operation test is performed by using a tester on the AT section for carrying out interoffice communication. An AT circuit 132a in the AT section 132 for carrying out interoffice communication is connected to an exchange of another office via a relay 132b during the ordinary interoffice communication. During the operation test, the AT circuit 132a is separated from the exchange of another office and connected to a tester via the relay 132b and a relay 131a of the selector 131 so that the operation test of the AT circuit 132a is performed by using the tester.

For the above reason, when the AT section 132 for carrying out interoffice communication is mounted to the shelf 103, the selector 131 must always be mounted at the same time.

An exchange which carries out interoffice communication by using digital communication does not always require an interoffice communication AT section for analog communication. Therefore, at the time when a user purchases an exchange, such an AT section is sometimes not mounted. However, the interoffice communication AT section for analog communication may be needed later. In such a case, the AT section can be mounted additionally, but a selector must always be mounted at the same time. There is a high possibility of forgetting the mounting of the selector because such additional mounting is performed on user's judgment, and because the interoffice communication AT section does not require a selector during the ordinary operation other than the test. In consideration of such a situation, a selector has so far been mounted in advance to an exchange having no interoffice communication AT section for analog communication.

It is also possible to give a caution in a printing matter to warn the user that a selector must always be mounted when an interoffice communication AT section is mounted. However, such a caution in a printed matter cannot achieve a decisive effect.

Needless to say, the mounting of a selector to an exchange having no interoffice communication AT section for analog communication is essentially wasteful, being undesirable in terms of product cost. Therefore, it has been requested that a selector be not mounted to such an exchange. In other words, in a system composed of a plurality of packages, the system cost can generally be decreased by mounting only the packages necessary for desired services. However, when the need for a new service arises after the system has been purchased and a package necessary for that service is purchased additionally, the user may reconfigure the system without knowing that another package is needed to perform that service in addition to the package to be purchased additionally. As a result, a complaint that the desired service is not performed may arise from the user. To eliminate such a complaint, an unnecessary package is mounted in advance, which increases the product cost.

In telephone exchanges, such a problem occurs not only between the interoffice communication AT section and the selector but also at the power source. Specifically, in telephone exchanges, −48V and +5V power supply systems are ordinarily used, but −5V, +2.5V, −2.5V, etc. may be used depending on the AT section. When an AT section using such a voltage is mounted to a shelf, a power supply package which can supply that voltage must be mounted, so that a problem similar to the above-described one occurs.

The −48V and +5V power supply systems used in telephone exchanges are classified into two types: a type such that both grounding sides are separated from each other, and a type such that both grounding sides are not separated, but connected to each other. If a package of connected type is mounted in the slot of a shelf of separated type, a trouble occurs on the power source on the shelf side or other packages connected to that power source. Therefore, the measures to prevent such a trouble have been asked to be taken.

SUMMARY OF THE INVENTION

An object of the present invention is to provide a mount-assisting apparatus in electronic equipment, which is configured so that all packages needed for a desired service can surely be mounted and unnecessary packages are not mounted.

Another object of the present invention is to provide a mount-assisting apparatus in electronic equipment, which prevents wrong connection of power supply systems.

To achieve the above object, the present invention provides an assisting apparatus for assisting to mount detachable packages to a shelf. The assisting apparatus comprises first display means for showing that at least one of a plurality of packages necessary to achieve a predetermined function is mounted to the shelf, and second display means for showing that all of the plural packages are mounted to the shelf.

Also, the assisting apparatus comprises: a particular package; a plurality of packages each of which achieves a predetermined function; a resistor, provided in the particular package, one terminal of which is connected to one polarity of a power source; a resistor, provided in each of the plural packages, one terminal of which is connected to the other polarity of the power source; a conduction line to which the other terminal of the resistor provided in the particular package and the other terminal of respective resistors provided in the plural packages are connected when the particular package and the plural packages are mounted to the shelf; judging means, connected to the conduction line, for judging whether at least one of the plural packages is mounted to the shelf on the basis of the voltage value of the conduction line; and display means for displaying the judgment result of the judging means.

Further, the assisting apparatus comprises: a particular package; a plurality of packages each of which achieves a predetermined function by being combined with the particular package; a resistor, provided in the particular package, one terminal of which is connected to one polarity of a power source; a resistor, provided in each of the plural packages, one terminal of which is connected to the one polarity of the power source; a first conduction line to which the other terminal of the resistor provided in the particular package is connected when the particular package is mounted to the shelf; a second conduction line to which the other terminal of the resistor provided in each of the plural packages is connected when each of the plural packages is mounted to the shelf; judging means, connected to the first and second conduction lines, for judging whether at least one of the plural packages is mounted to the shelf on the basis of the voltage values of the conduction lines; and display means for displaying the judgment result of the judging means.

Further, the assisting apparatus comprises: a particular package; a plurality of packages each of which achieves a predetermined function by being combined with the particular package; a resistor, provided in each of the plural packages, one terminal of which is connected to one polarity of a power source; a conduction line to which the other terminal of the resistor provided in each of the plural packages is connected when each of the plural packages is mounted to the shelf; judging means, connected to the conduction line, for judging whether at least one of the plural packages is mounted to the shelf on the basis of the voltage value of the conduction line; and display means for displaying the judgment result of the judging means.

Further, the assisting apparatus comprises: two packages necessary to achieve a predetermined function; a resistor, provided in each of the two packages, one terminal of which is connected to one polarity of a power source; two conduction lines to which the other terminal of each of the resistors is connected, respectively, when each of the two packages is mounted to the shelf; and judging and display means, provided in each of the two packages, and connected to each of the two conduction lines, for judging whether the package to which the corresponding resistor is installed is mounted to the shelf, and for displaying the judgment result.

Still further, the assisting apparatus comprises: a first connecting portion, which has two power supply systems and in which the grounding sides of these power supply systems are separated from each other, of a plurality of connecting portions of the shelf to which various packages are mounted; a second connecting portion, which has two power supply systems and in which the grounding sides of these power supply systems are not separated from each other, of a plurality of connecting portions of the shelf; a first package, which has two power supply systems and in which the grounding sides of these power supply systems are separated from each other, of the various packages; a second package, which has two power supply systems and in which the grounding sides of these power supply systems are not separated from each other, of the various packages; a first power supply terminal for relay, provided at a predetermined first position of the first connecting portion; a second power supply terminal for relay, provided at a predetermined second position different from the predetermined first position, of the second connecting portion; a first relay driver, provided in the first package and having a connecting terminal at a position connectable to the first power supply terminal for relay; a first grounding line, provided in the first package and connectable to either of two grounding sides of two power supply systems of the first connecting portion; a first relay, provided halfway in the first grounding line and driven by the first relay driver; a second relay driver, provided in the second package and having a connecting terminal at a position connectable to the second power supply terminal for relay; a second ground line, provided in the second package and connectable to common grounding side of two power supply systems of the second connecting portion; and a second relay, provided halfway in the second grounding line and driven by the second relay driver.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 3 is a view showing the conditions for lighting/extinction of LED;

DESCRIPTION OF THE PREFERRED EMBODIMENTS

First, the principle of the present invention will be described.

The assisting apparatus in accordance with the present invention comprises a first display means 3 for showing that at least one of a plurality of packages 1a to 1n necessary for achieving a predetermined function is mounted to a shelf 2, and a second display means 4 for showing that all of the plural packages 1a to 1n are mounted to the shelf 2.

Figure 1:
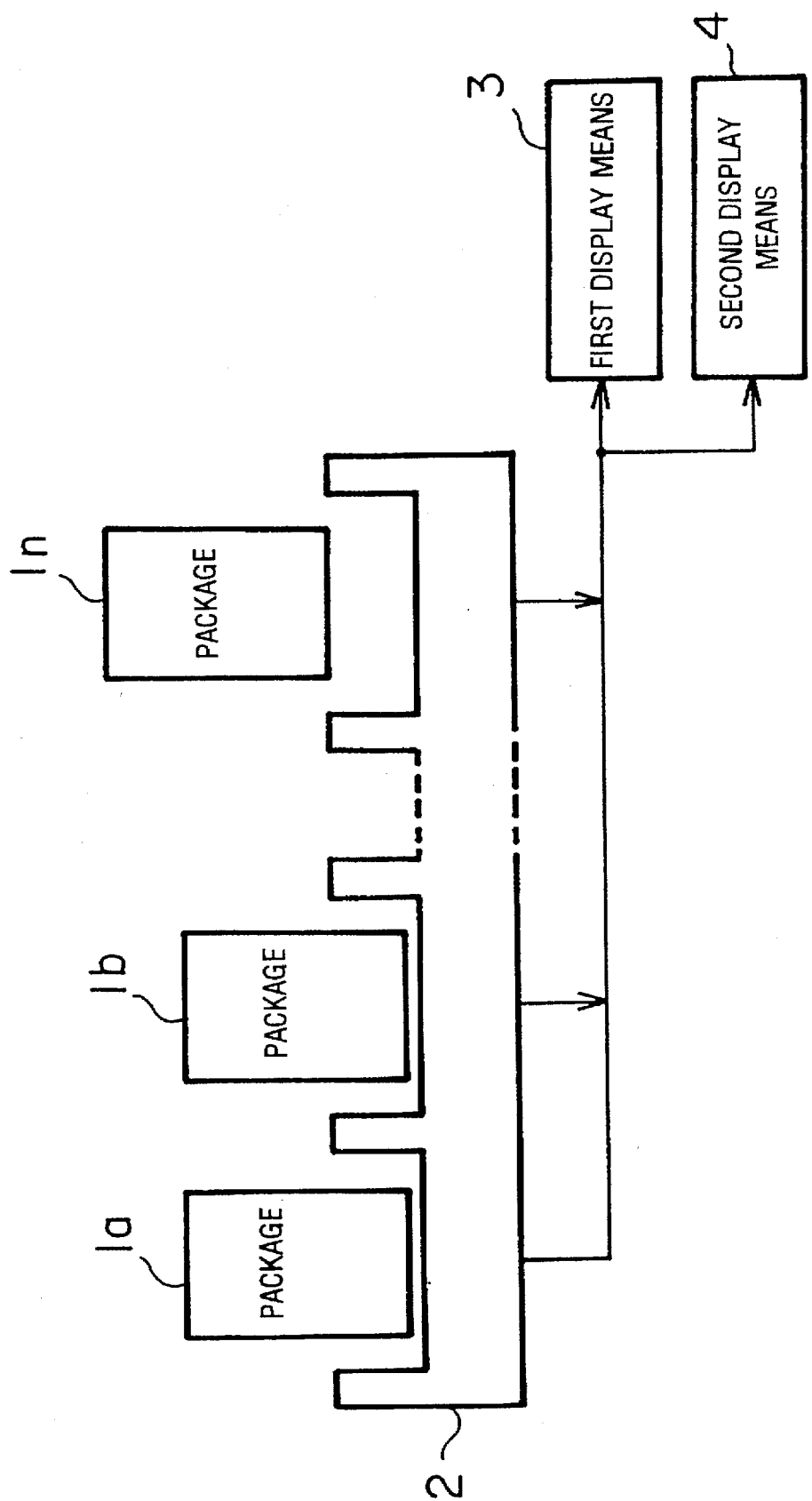
FIG. 1 is a view for illustrating the principle of the present invention.

Although not shown in FIG. 1, another assisting apparatus is provided with a power supply terminal for relay at a position different from each other depending on two power supply systems for a plural connections of the shelf. Also, the package is provided with a relay driver having a connection terminal at a position connectable to the power supply terminal for the corresponding relay depending on the power supply system, and a relay, which is driven by the corresponding relay driver, is provided at the intermediate portion of each power supply line.

In the above-described configuration, the plural packages 1a to 1n cannot achieve a predetermined function unless all of them are mounted to the shelf 2. Therefore, when at least one of the plural packages 1a to 1n is mounted to the shelf 2, the first display means 3 perform first display to urge the user to mount the remaining packages on the basis of the mounting state. The first display is performed by, for example, the lighting of LED.

When all of the plural packages 1a to 1n are mounted to the shelf 2, a predetermined function is achieved. Therefore, the second display means 4 performs second display on the basis of the mounting state of the packages. The second display is performed by, for example, the extinction of LED.

When a predetermined function becomes unnecessary, all of the plural packages 1a to 1n should be pulled out. If even one of the plural packages 1a to 1n is left mounted, the first display is performed, which prevents the package from being left.

Thus, the assisting apparatus can be configured so that all packages necessary for desired service (function) can surely be mounted, while unnecessary packages are not mounted.

In another assisting apparatus, if the power supply systems match when the packages are mounted to the connecting portion of the shelf, the position of the power supply terminal for relay coincides with the position of the connection terminal of relay driver, so that the relay driver is driven. The relay driver drives the corresponding relay, by which the power supply line is conducted. If the power supply systems do not match, the position of the power supply terminal for relay does not coincide with the position of the connection terminal for relay driver, so that the relay driver is not driven. The relay driver does not drive the corresponding relay, by which the power supply line is shut off.

Therefore, wrong connection of power supply system is prevented, so that a trouble caused by the wrong connection can be avoided.

Next, the embodiments of the present invention will be described in detail. First, a first embodiment will be described.

Figure 2:
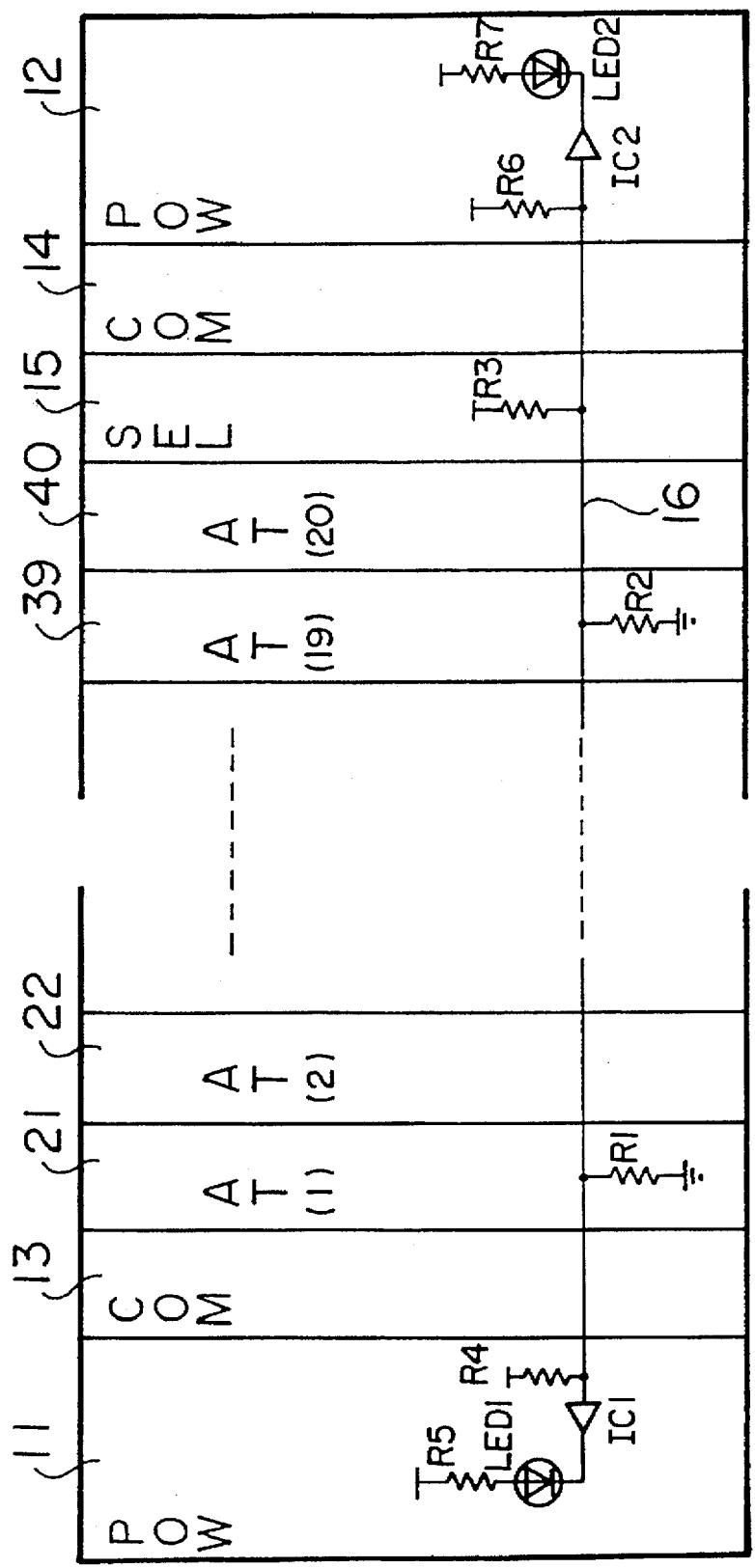
FIG. 2 is a view showing a configuration of an analog trunk shelf of a first embodiment.

FIG. 2 is a view showing a configuration of an analog trunk shelf of the first embodiment. This figure shows packages mounted to a shelf. Two power source sections (POW) 11 and 12 generate various voltage values to supply them to other packages. Common sections (COM) 13 and 14 of redundancy configuration carry out communications with an external network. AT sections 21 to 40 consisting of 20 packages at the maximum, which are the main part of the analog trunk shelf, provide various services for each package. Specifically, they achieve various functions such as communication with an exchange of another telephone office (interoffice communication), tripartite conversation, and maintenance service, depending on the type of the package. A selector section (SEL) 15 carries out connection control in performing operation test of AT section for interoffice communication. In this embodiment, AT section 21 [AT(1)] and AT section 39 [AT(19)] are regarded as AT sections for interoffice communication. Therefore, when either of AT section 21 and AT section 39 is mounted to the shelf, the selector section 15 must always be mounted. When none of AT 21 section and AT 39 section are mounted to the shelf, the selector section 15 need not be mounted.

On a back wiring board of the shelf, to which packages are mounted as described above, a SELCHK line 16 traversing the power source sections 11 and 12, the AT sections 21 to 40, and the selector section 15 is provided. At the AT sections 21 and 39 for interoffice communication, resistors R1 and R2 are provided, respectively. One terminal of the resistor R1, R2 is grounded. The AT sections 21 and 39 are so configured that when they are mounted to the shelf, the other terminals of the resistors R1 and R2 are connected to the SELCHK line 16. The selector section 15 is provided with a resistor R3, and one terminal of the resistor R3 is connected to a power source of +5 V. The selector section 15 is so configured that when it is mounted to the shelf, the other terminal of the resistor 3 is connected to the SELCHK line 16. The power source section 11 is provided with a resistor R4. One terminal of the resistor R4 is connected to the power source of +5 V, and the other terminal thereof is connected to the SELCHK line 16. The power source section 11 is further provided with an IC 1, a LED 1, and a resistor R5. The input side of the IC 1 is connected to the SELCHK line 16, and the LED 1 and the resistor R5 are connected in the named order to the output side of the IC 1. To the resistor R5 is connected the power source of +5 V. The power source section 12, like the power source section 11, is provided with a resistor R6, an IC 2, a LED 2, and a resistor R7 to provide redundancy configuration. The resistors R1 and R2 each are set at 10 KΩ, the resistor R3 at 300Ω, and the resistors R4 and R6 each at 150Ω. The resistors R5 and R7 are protective resistors for the LED 1 and the LED 2, respectively. Both of IC 1 and IC 2 are TTL's (Transistor Transistor Logics), outputting a low level signal if the input voltage is not higher than 0.7 V, and a high level signal if it is not lower than 2.4 V. The LED 1 and the LED 2 come on when the IC 1 and the IC 2 output a low level signal, respectively, while they go out when the IC 1 and the IC 2 output a high level signal, respectively. When the LED 1 comes on, the LED 2 also comes on, and when the LED 1 goes out, the LED 2 also goes out.

FIG. 3 shows the conditions of lighting/extinction of the LED 1 and LED 2, changing in accordance with the number of mounted AT sections for interoffice communication and the mounting state of the selector 15. According to FIG. 3, for example, when the selector 15 is not mounted and one package of AT section 21 for interoffice communication is mounted to the shelf, the voltage value on the SELCHK line 16 is 0.6 V, so that the LED 1 and the LED 2 come on. If the selector 15 is mounted afterwards, the voltage value on the SELCHK line 16 becomes 4.9 V, so that the LED 1 and the LED 2 go out.

As is apparent from FIG. 3, if at least one AT section for interoffice communication is mounted to the shelf when the selector 15 is not mounted, the LED 1 and the LED 2 come on, urging the user to mount the selector 15. If none of AT sections for interoffice communication are mounted to the shelf when the selector 15 is mounted, the LED 1 and the LED 2 come on, telling the user that the selector 15 is mounted wastefully. Thus, it is possible to surely mount all packages necessary for the desired service (function) and to prevent unnecessary packages from being mounted.

Next, a second embodiment will be described.

Figure 4:
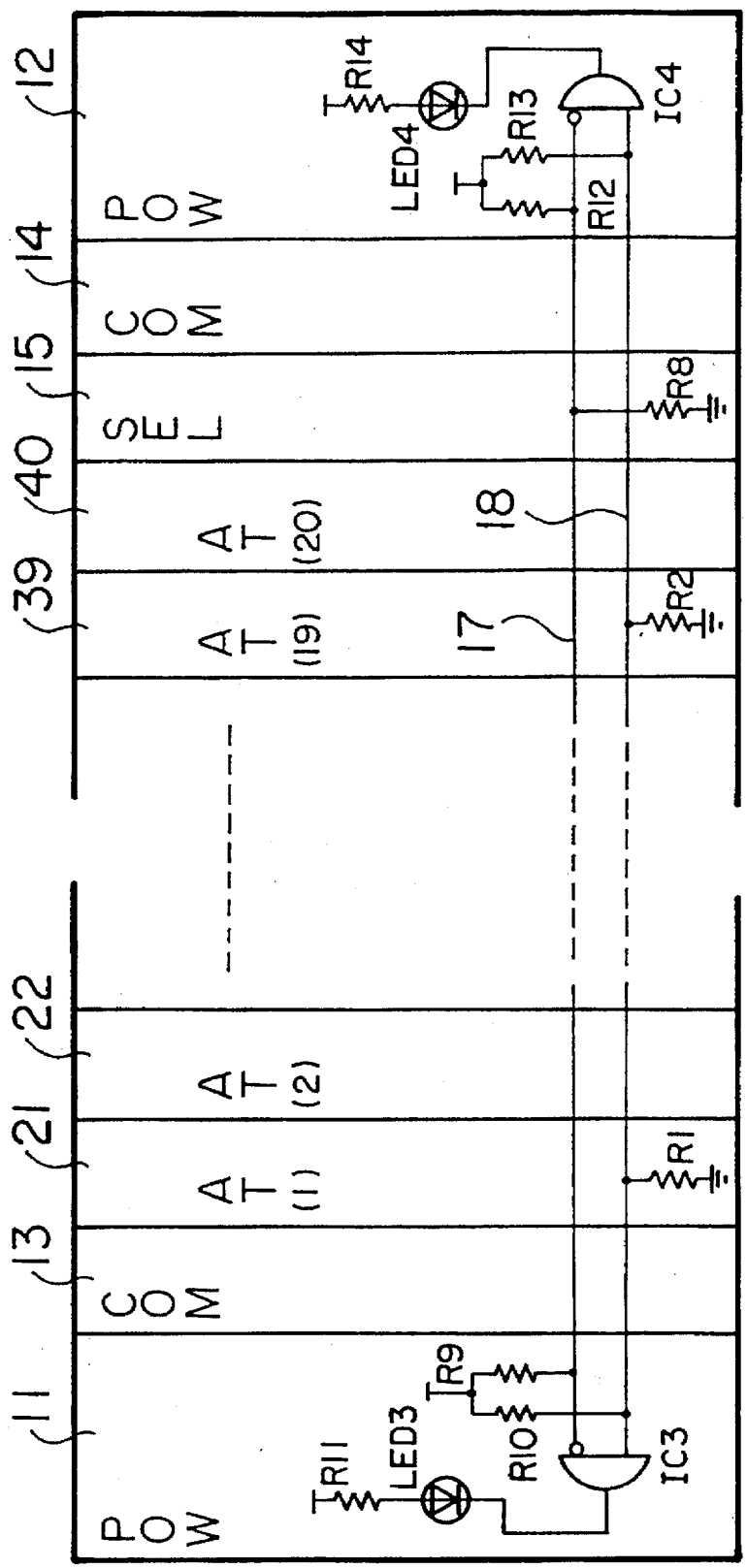
FIG. 4 is a view showing a configuration of an analog trunk shelf of a second embodiment.

FIG. 4 is a view showing a configuration of an analog trunk shelf of the second embodiment. Since the configuration of the second embodiment is basically the same as that of the first embodiment, the similar reference characters refer to the similar elements, and the description is omitted except for different parts.

In the second embodiment, a SELHAVE line 17 and a SELNEES line 18, traversing power source sections 11 and 12, AT sections 21 to 40, and a selector section 15, are provided on a back wiring board of a shelf. At the AT sections 21 and 39 for interoffice communication, resistors R1 and R2 are provided, respectively. One terminal of the resistor R1, R2 is grounded. The AT sections 21 and 39 are so configured that when they are mounted to the shelf, the other terminals of the resistors R1 and R2 are connected to the SELNEES line 18. The selector section 15 is provided with a resistor R8, and one terminal of the resistor R8 is grounded. The selector section 15 is so configured that when it is mounted to the shelf, the other terminal of the resistor R8 is connected to the SELHAVE line 17. The power source section 11 is provided with resistors R9 and R10. One terminal of the respective resistors R9 and R10 is connected to the power source of +5 V, and the other terminal of the resistor R9 is connected to the SELHAVE line 17 and that of the resistor R10 to the SELNEED line 18. The power source section 11 is further provided with an IC 3, a LED 3, and a resistor R11. The IC 3 is made up of an inverting circuit and an AND circuit. The SELHAVE line 17 is connected to one input side of AND circuit via the inverting circuit, while the SELNEED line 18 is connected to the other input side of AND circuit. The LED 3 and the resistor R11 are connected in the named order to the output side of the IC 3. To the resistor R11 is connected the power source of +5 V. The power source section 12, like the power source section 11, is provided with resistors R12 and R13, an IC 4, a LED 4, and a resistor R14 to provide redundancy configuration.

In this configuration, when none of the AT sections for interoffice communication are mounted to the shelf, the voltage value on the SELNEES line 18 is at a high level, but when at least one AT section for interoffice communication is mounted, the voltage value on the SELNEED line 18 is at a low level, so that the IC 3 and the IC 4 output a low level signal. Therefore, the LED 3 and the LED 4 come on. If the selector 15 is not mounted to the shelf, the voltage value on the SELHAVE line 17 is at a high level, and if the selector 15 is mounted to the shelf, the voltage value on the SELHAVE line 17 is at a low level.

In the first embodiment described above, since the IC 1 and the IC 2 make judgment by comparing an input voltage with the threshold, a proper input voltage value cannot be set depending on the number of mounted packages, so that the IC 1 and the IC 2 cannot make proper judgment. Also, a plurality of states such as the presence of selector and the presence of −48 V power source cannot be displayed individually at the same time. The second embodiment eliminates these drawbacks.

In the above first and second embodiments, the LED display is changed in accordance with the mounting state of selector. Instead, the LED display may be performed merely in accordance with the mounting state of the AT sections for interoffice communication independently of the mounting state of selector.

Also, audible display means such as a buzzer may be used in place of a LED, which is visible means.

Instead of that the LED is turned on when the selector becomes necessary due to the mounting of the AT sections for interoffice communication, the LED may be turned on when the selector is mounted in spite of the fact that the selector becomes unnecessary because none of the AT sections for interoffice communication are mounted. By this lighting of LED, the AT sections which have become unnecessary can be used in another shelf requiring the selector.

Next, a third embodiment will be described.

Figure 5:
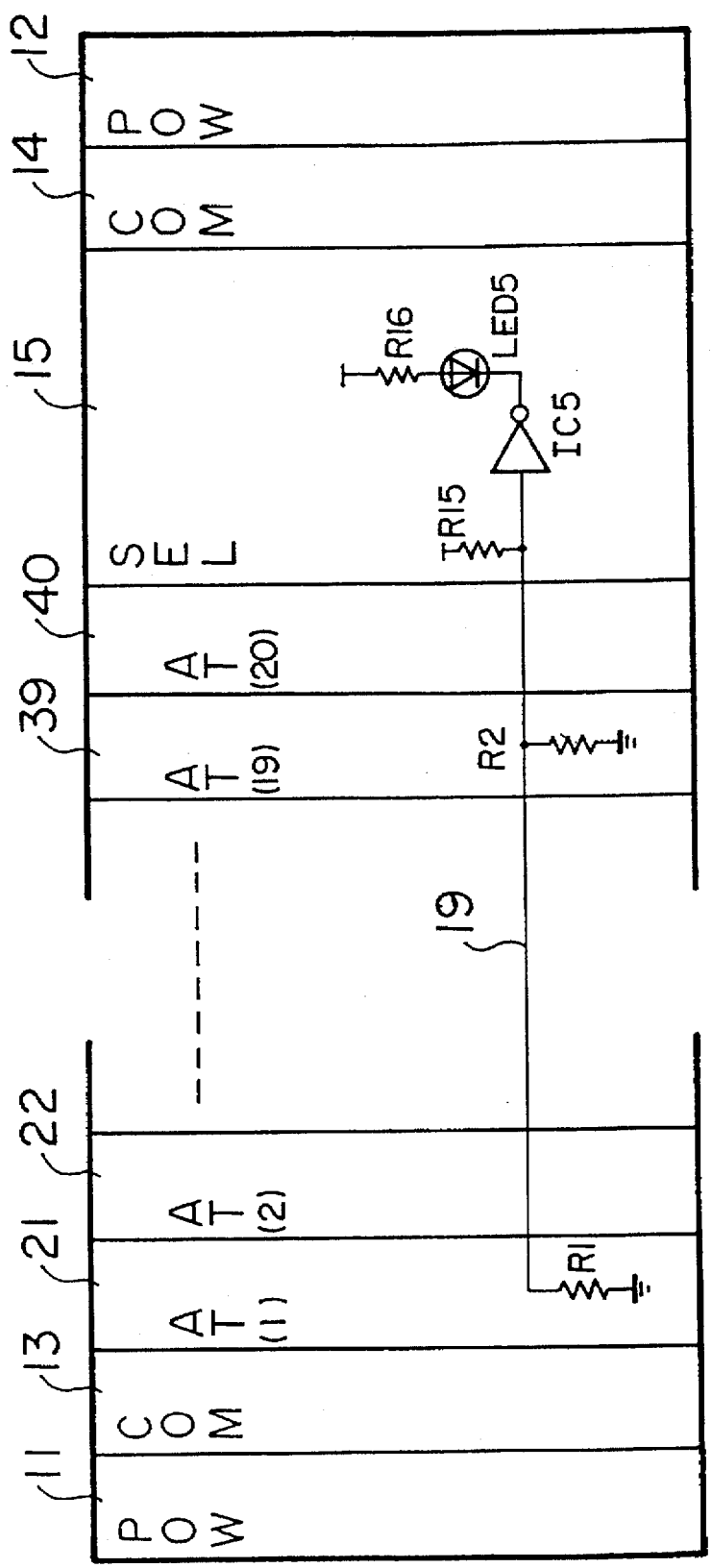
FIG. 5 is a view showing a configuration of an analog trunk shelf of a third embodiment.

FIG. 5 is a view showing a configuration of an analog trunk shelf of the third embodiment. Since the configuration of the third embodiment is basically the same as that of the first embodiment, the similar reference characters refer to the similar elements, and the description is omitted except for different parts.

In the third embodiment, a SELCHK line 19 traversing AT sections 21 to 40 and a selector section 15 is provided on a back wiring board of a shelf. At the AT sections 21 and 39 for interoffice communication, resistors R1 and R2 are provided, respectively. One terminal of the resistor R1, R2 is grounded. The AT sections 21 and 39 are so configured that when they are mounted to the shelf, the other terminals of the resistors R1 and R2 are connected to the SELCHK line 19. The selector section 15 is provided with a resistor R15, and one terminal of the resistor R15 is connected to a power source of +5 V. At the other terminal of the resistor R15, an IC 5, a LED 5, and a resistor R16 are provided in the named order. The IC 5 is made up of an inverter circuit. The resistors R1 and R2 each are set at 10Ω, and the resistor R15 at 100Ω. The selector 15 is so configured that when it is mounted to the shelf, the other terminal of the resistor R15 is connected to the SELCHK line 19.

This third embodiment is effective in the case where the AT sections for interoffice communication and the selector have been mounted from the beginning, and later the AT sections for interoffice communication become unnecessary because of a change, for example, switching from analog circuit to digital circuit. Specifically, when the AT sections 21 and 39 and the selector section 15 are mounted, the voltage value on the SELCHK line 19 is not higher than 0.45 V, so that the IC 5 outputs a high level signal. Therefore, the LED 5 goes out. When the AT sections 21 and 39 are removed, the voltage value on the SELCHK line 19 becomes 5 V, so that the IC 5 outputs a low level signal. Accordingly, the LED 5 comes on, telling the user that the selector section 15 is mounted in spite of the fact that it is unnecessary.

The apparatus of the third embodiment is less costly than the apparatuses of the first and second embodiments because it requires only one set of detection circuit and display circuit though two sets are required in the first and second embodiments. Also, since these circuits are mounted on the selector, low cost can further be achieved when the selector is not mounted.

Next, a fourth embodiment will be described.

Figure 6:
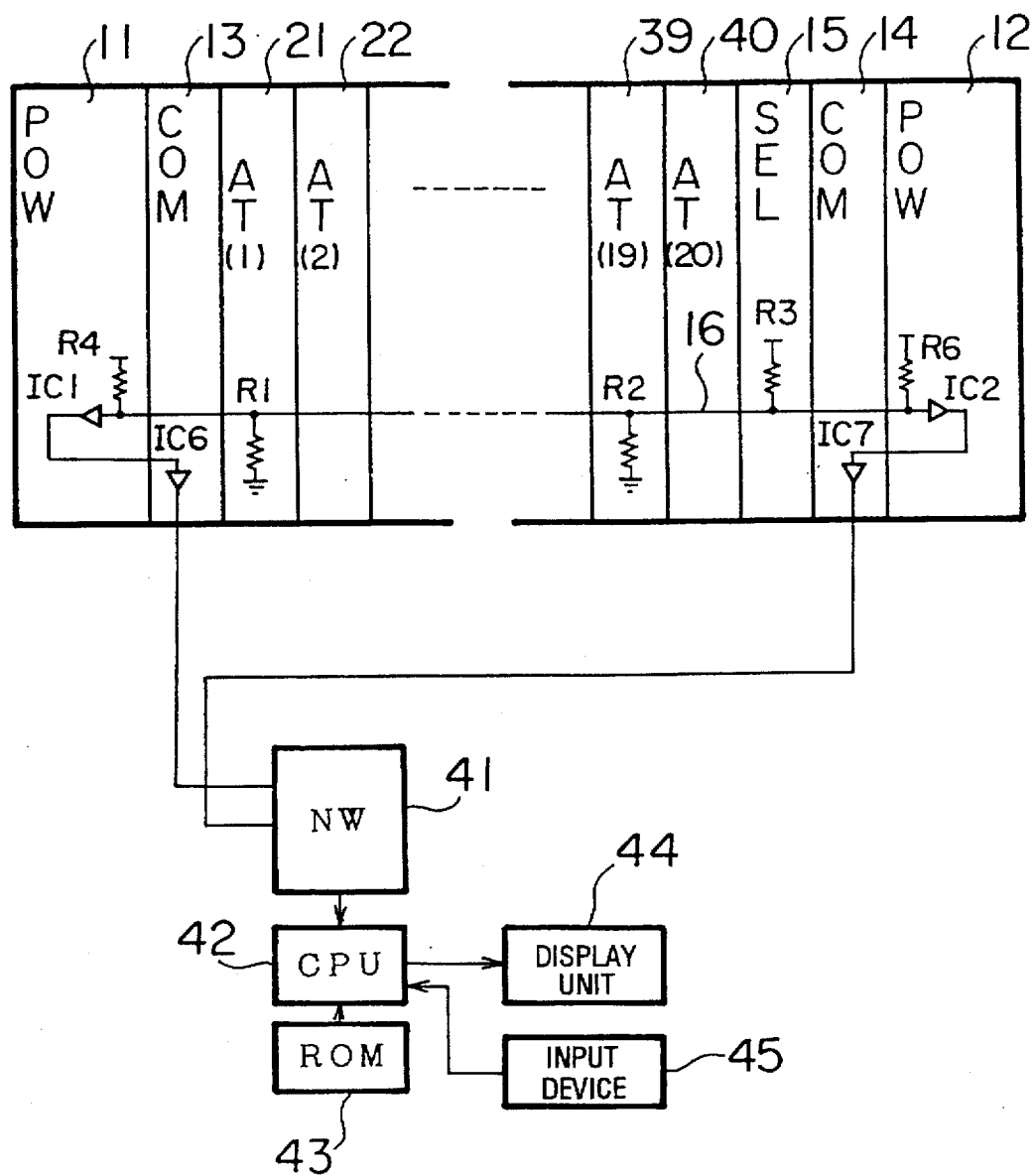
FIG. 6 is a view showing a configuration of a fourth embodiment.

FIG. 6 is a view showing an analog trunk shelf of the fourth embodiment and external equipment attached thereto. Since the configuration of the fourth embodiment is basically the same as that of the first embodiment, the similar reference characters refer to the similar elements, and the description is omitted.

In the fourth embodiment, like the first embodiment, a SELCHK line 16 is provided on a back wiring board, resistors R1 and R2 are provided at AT sections 21 and 39 for interoffice communication, respectively, a resistor R3 is provided at a selector section 15, a resistor R4 and an IC 1 are provided at a power source section 11, and a resistor R6 and an IC 2 are provided at a power source section 12.

In addition to these elements, the common sections 13 and 14 are provided with an IC 6 and an IC 7 for amplification. The outputs of the IC 1 and the IC 2 are connected to an external network (NW) 41 via the IC 6 and the IC 7, respectively. To the network 41 is connected a CPU 42. A ROM 43, a display unit 44, and an input device 45 are connected to the CPU 42. The CPU 42 operates in accordance with the program stored in the ROM 43, and judges the mounting states of the AT sections 21 and 39 for interoffice communication and the selector 15 on the basis of the data sent from the network 41. The judgment result is displayed on the display unit 44. Although not shown in the figure, the CPU 42 can display the entire system on one display unit 44 by inputting data from other analog trunk shelves, without the need for installing a display unit for each analog trunk shelf. In the case where the display unit 44 is a general-purpose display unit such as a CRT display, it is not proper to use the display unit 44 always for such display only. Therefore, display is performed only when a display instruction is given from the input device 45.

In the fourth embodiment, the resistor 4 and the IC 1, and the resistor 6 and the IC 2, which constitute a detection circuit, are provided at the power source sections 11 and 12, respectively. Instead, these detection circuits may be provided at the common sections 13 and 14, respectively.

Next, a fifth embodiment will be described.

Figure 7:
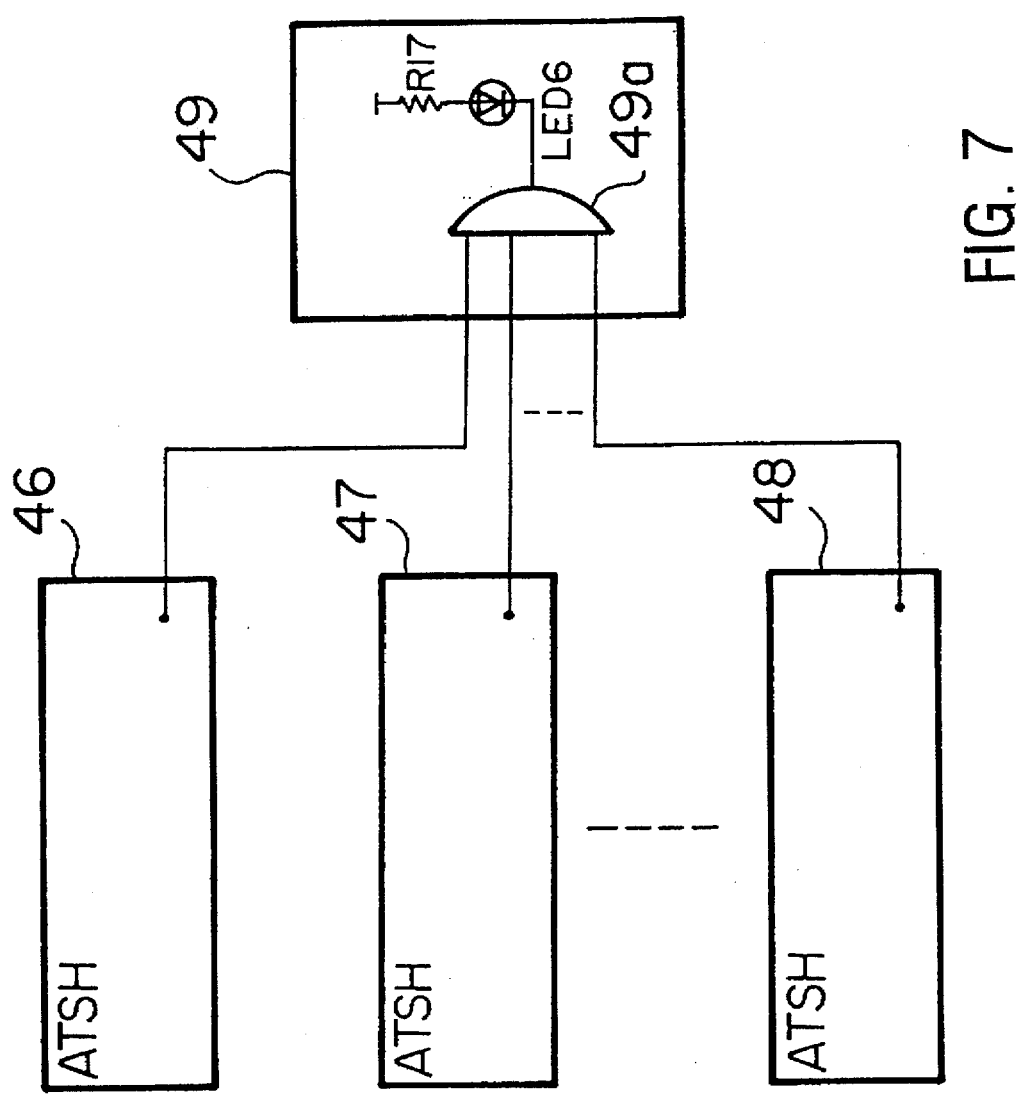
FIG. 7 is a view showing a configuration of a fifth embodiment.

FIG. 7 is a block diagram showing a plurality of analog trunk shelves and a display unit of the fifth embodiment. In the figure, the analog trunk shelves 46 to 48 has no an individual display unit, which the analog trunk shelf of the first embodiment has. All outputs are sent to a collective display unit 49. The collective display unit 49 is made up of a LED 6, a protective resistor R17 inserted between the LED 6 and the power source, and an AND circuit 49a. In this case, only when high level signals come from all analog trunk shelves 46 to 48, the AND circuit 49a outputs a high level signal to turn off the LED 6, which tells that all of the analog trunk shelves have no trouble. If a low level signal comes from any of the analog trunk shelves 46 to 48, the AND circuit 49a outputs a low level signal to turn on the LED 6, which tells that any of the analog trunk shelves 46 to 48 has a trouble. The trouble in this case means that a selector is not mounted though an AT section for interoffice communication is mounted.

Next, a sixth embodiment will be described.

Figure 8:
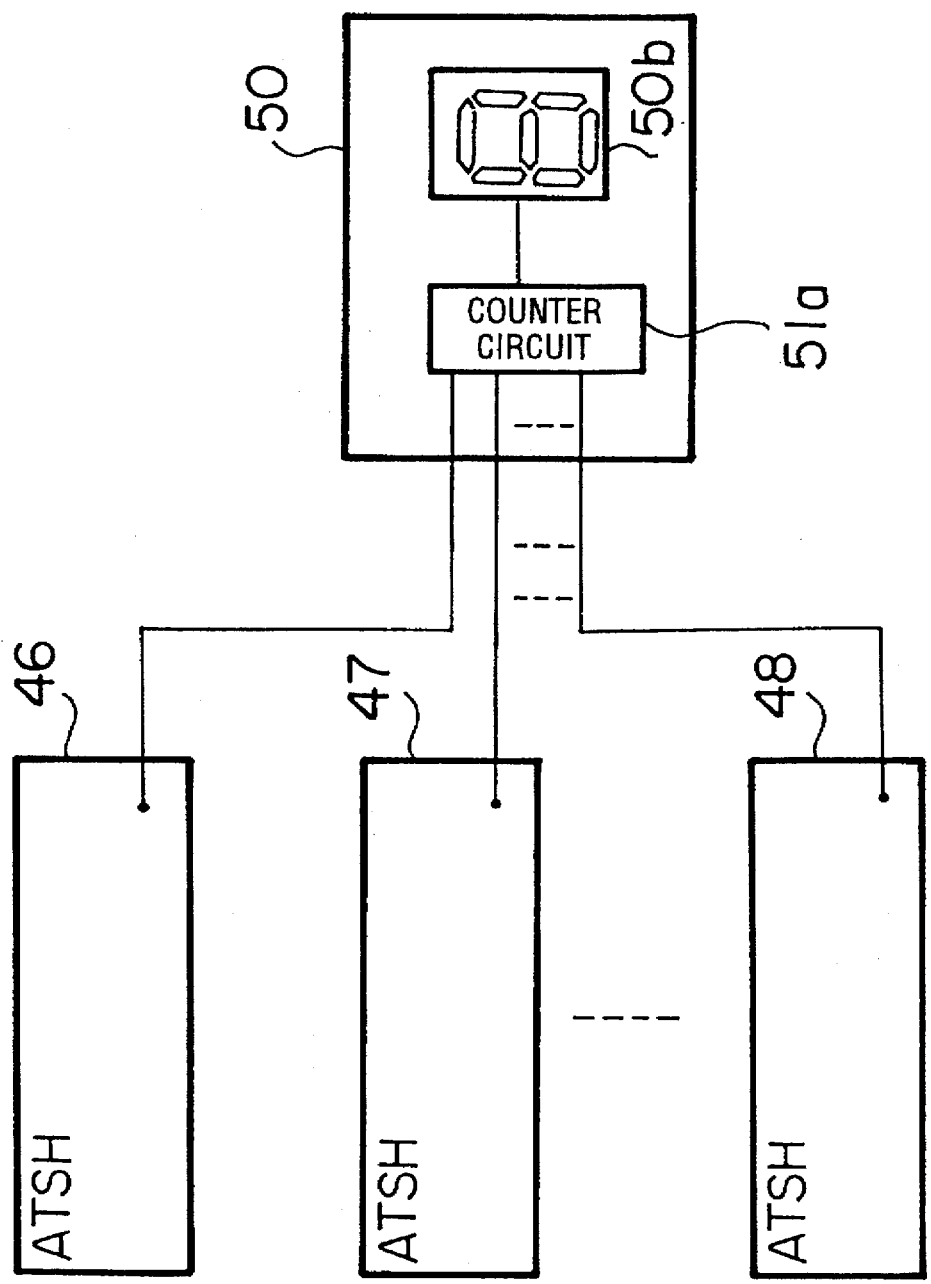
FIG. 8 is a view showing a configuration of a sixth embodiment.

FIG. 8 is a block diagram showing a plurality of analog trunk shelves and a display unit of the sixth embodiment. Since the configuration of the sixth embodiment is basically the same as that of the fifth embodiment, the similar reference characters refer to the similar elements, and the description is omitted.

In the sixth embodiment, the outputs of the analog trunk shelves 46 to 48 are sent to an abnormal number display unit 50. The abnormal number display unit 50 is made up of a counter circuit 51a and an indicator 50b of 7 segments. The counter circuit 51a, receiving the output of the analog trunk shelves 46 to 48, counts the number of analog trunk shelves outputting a high level signal. The abnormal number display unit 50 drives the indicator 50b, on the basis of the counted number, to display that number. Therefore, it is found how many analog trunk shelves exist in which a selector is not mounted though an AT section for interoffice communication is mounted.

Next, a seventh embodiment will be described.

Figure 9:
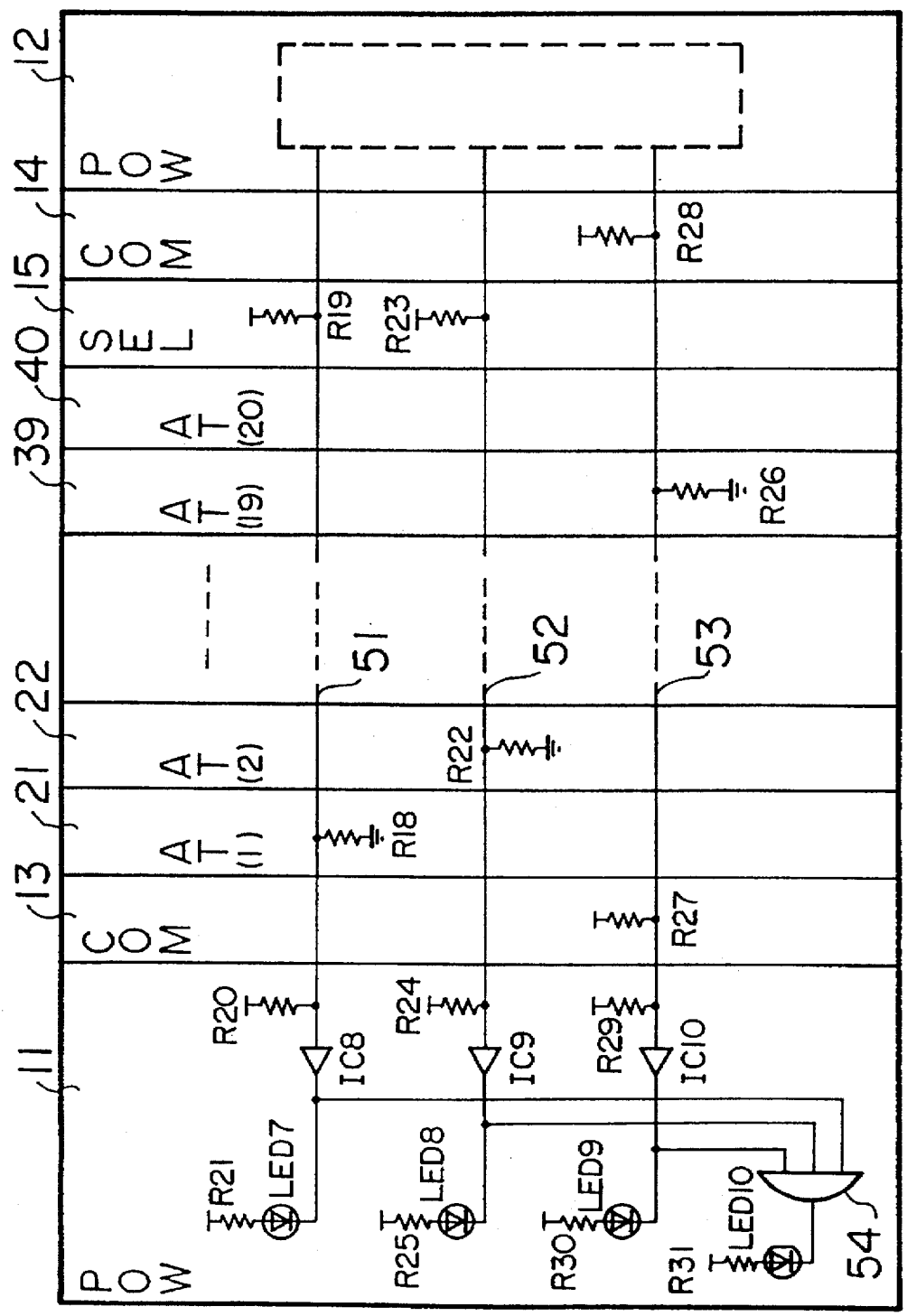
FIG. 9 is a view showing a configuration of an analog trunk shelf of a seventh embodiment.

FIG. 9 is a view showing a configuration of an analog trunk shelf of the seventh embodiment. Since the configuration of the seventh embodiment is basically the same as that of the first embodiment, the similar reference characters refer to the similar elements, and the description is omitted.

In the seventh embodiment, the package mounting states regarding three conditions can be displayed collectively. The three conditions include a first condition that an AT section for interoffice communication and a selector must be mounted at the same time, a second condition that an AT section requiring a special voltage and a power source section for supplying the special voltage (in this embodiment, a special voltage supply circuit is added to the selector) must be mounted at the same time, and a third condition that an AT section requiring a common section and a common section (although any of the mounted AT sections normally requires a common section, it is possible that none of the mounted AT sections require a common section) must be mounted at the same time.

In order to detect and display the state in which the first condition is satisfied, if, for example, an AT section 21 is for interoffice communication and requires a selector 15, a SELCHK line 51 is provided on a back wiring board of the shelf. The AT section 21 is provided with a resistor R18, and one terminal of the resistor R18 is grounded. The AT section 21 is so configured that when it is mounted to the shelf, the other terminal of the resistor R18 is connected to the SELCHK line 51. The selector section 15 is provided with a resistor R19, and one terminal of the resistor 19 is connected to a power source of +5 V. The selector section 15 is so configured that when it is mounted to the shelf, the other terminal of the resistor R19 is connected to the SELCHK line 51. A resistor R20 is provided at the power source section 11. One terminal of the resistor R20 is connected to the power source of +5 V, and the other terminal thereof is connected to the SELCHK line 51. Further, the power source section 11 is provided with an IC 8, a LED 7, and a resistor R21. The input side of the IC 8 is connected to the SELCHK line 51. A LED 7 and a resistor R21 are connected to the output side of the IC 8 in the named order, and the power source of +5 V is connected to the resistor R21. The power source section 12 is configured in the same way as the power source section 11 to provide redundancy configuration. The IC 8 outputs a low level signal if the input voltage is lower than the threshold, and outputs a high level signal if the input voltage is higher than the threshold. The LED 7 comes on if the IC 8 outputs a low level signal, and goes out if the IC 8 outputs a high level signal.

Therefore, the LED 7 comes on if the first condition is not satisfied.

For the detection and display of the state in which the second condition is satisfied, it is assumed, for example, that an AT section 22 requires −5 V and a special power supply circuit for −5 V is added to the selector 15. A −5 V CHK line 52 is provided on the back wiring board of the shelf. The AT section 22 is provided with a resistor R22, and one terminal of the resistor R22 is grounded. The AT section 22 is so configured that when it is mounted to the shelf, the other terminal of the resistor R22 is connected to the −5 V CHK line 52. The selector section 15 is provided with a resistor R23, and one terminal of the resistor R23 is connected to a power source of +5 V. The selector section 15 is so configured that when it is mounted to the shelf, the other terminal of the resistor R23 is connected to the −5 V CHK line 52. The power source section 11, like the circuit for the first condition, is provided with a resistor R24, an IC 9, a LED 8, and a resistor R25. The power source section 12 is configured in the same way as the power source section 11 to provide redundancy configuration. The operation of the IC 9 and the LED 8 are performed in the same way as the circuit for the first condition.

Therefore, the LED 8 comes on when the second condition is not satisfied.

For the detection and display of the state in which the third condition is satisfied, it is assumed, for example, that an AT section 39 requires common sections 13 and 14. A COMCHK line 53 is provided on the back wiring board of the shelf. The AT section 39 is provided with a resistor R26, and one terminal of the resistor R26 is grounded. The AT section 39 is so configured that when it is mounted to the shelf, the other terminal of the resistor R26 is connected to the COMCHK line 53. The common sections 13 and 14 are provided with resistors R27 and R28, respectively, and one terminal of the resistors R27 and R28 each is connected to the power source of +5 V. The common sections 13 and 14 are so configured that the other terminals of the resistors R27 and R28 are connected to the COMCHK line 53. The power source 11, like the circuit for the first condition, is provided with a resistor R29, an IC 10, a LED 9, and a resistor R30. The power source section 12 is configured in the same way as the power source section 11 to provide redundancy configuration. The operation of the IC 10 and the LED 9 are performed in the same way as the circuit for the first condition.

Therefore, the LED 9 comes on when the third condition is not satisfied.

The outputs of the IC 8, IC 9, and IC 10 are introduced to an AND circuit 54, and a LED 10 for display and a resistor R31 are provided on the output side of the AND circuit 54.

Therefore, display is performed individually for the three conditions, and the LED 10 comes on if even one of the three conditions is not satisfied.

Although the display by means of the LED's 7 to 9 and the display by means of the LED 10 are performed in the above seventh embodiment, either of the displays may be performed.

Also, in the above seventh embodiment, the display of whether an AT section requiring a special voltage of −5 V and a selector for supplying that voltage are mounted at the same time is performed regarding the second condition. Instead, the display of whether an AT section having a high consumed current and a selector for supplying that current are mounted at the same time may be performed.

Next, an eighth embodiment will be described.

Figure 10:
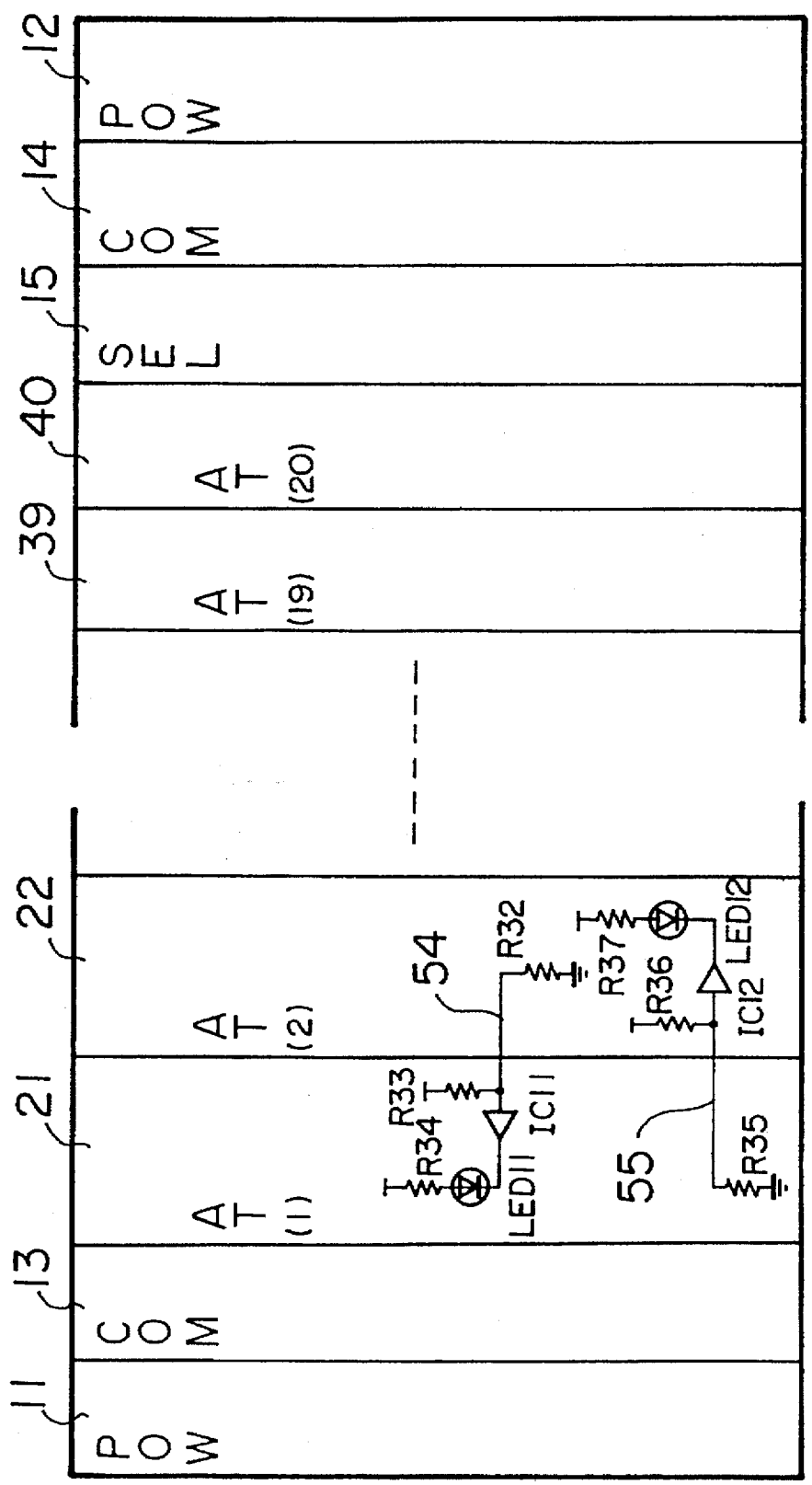
FIG. 10 is a view showing a configuration of an analog trunk shelf of an eighth embodiment.

FIG. 10 is a view showing a configuration of an analog trunk shelf of the eighth embodiment. Since the configuration of the eighth embodiment is basically the same as that of the first embodiment, the similar reference characters refer to the similar elements, and the description is omitted.

In the eighth embodiment, a predetermined function cannot be achieved by one package, and two packages are required. For example, an AT section 21 and an AT section 22 must be mounted to the shelf at the same time. In FIG. 10, an ATCHK line 54 is provided on a back wiring board of the shelf. The AT 22 is provided with a resistor R32, and one terminal of the resistor R32 is grounded. The AT section 22 is so configured that when it is mounted to the shelf, the other terminal of the resistor R32 is connected to the ATCHK line 54. The AT section 21 is provided with a resistor R33. One terminal of the resistor R33 is connected to the power source of +5 V, and the other terminal thereof is connected to the ATCHK line 54. Further, the AT section 21 is provided with an IC 11, a LED 11, and a resistor R34. The output side of the IC 11 is connected to the ATCHK line 54, and a LED 11 and a resistor R34 are connected to the output side of the IC 11 in the named order. To the resistor R34 is connected the power source of +5 V. The IC 11 outputs a low level signal if the input voltage is lower than the threshold, and outputs a high level signal if the input voltage is higher than the threshold. The LED 11 comes on when the IC 11 outputs a low level signal, and goes out when the IC 11 outputs a high level signal.

Similarly, an ATCHK line 55 is provided on the back wiring board of the shelf, and a resistor R35, a resistor R36, an IC 12, a LED 12, and a resistor R37 are provided in such a manner that the AT section 22 and the AT section 21 are changed with each other.

Therefore, if the AT section 22 and the AT section 21 are not mounted to the shelf, the LED 11 and the LED 12 do not come on. If the AT section 22 is not mounted, the LED comes on, urging the user to mount the AT section 22. If the AT section 21 is not mounted, the LED 12 comes on, urging the user to mount the AT section 21.

The above embodiments may be combined appropriately.

Also, although in the above description an example of a built-in type telephone exchange has been explained, the present invention can be applied to a built-in type personal computer or the like.

Next, a ninth embodiment will be described.

The ninth embodiment deals with a case where, in a shelf of a telephone exchange using two power supply systems of −48 V and +5 V and packages mounted thereto, a type such that the grounding sides of two power supply systems are separated from each other and a type such that the grounding sides are connected to each other without being separated exist mixedly. The grounding side of the −48 V power supply system is represented by SG, and the grounding side of the +5 V power supply system by E.

Figure 11:
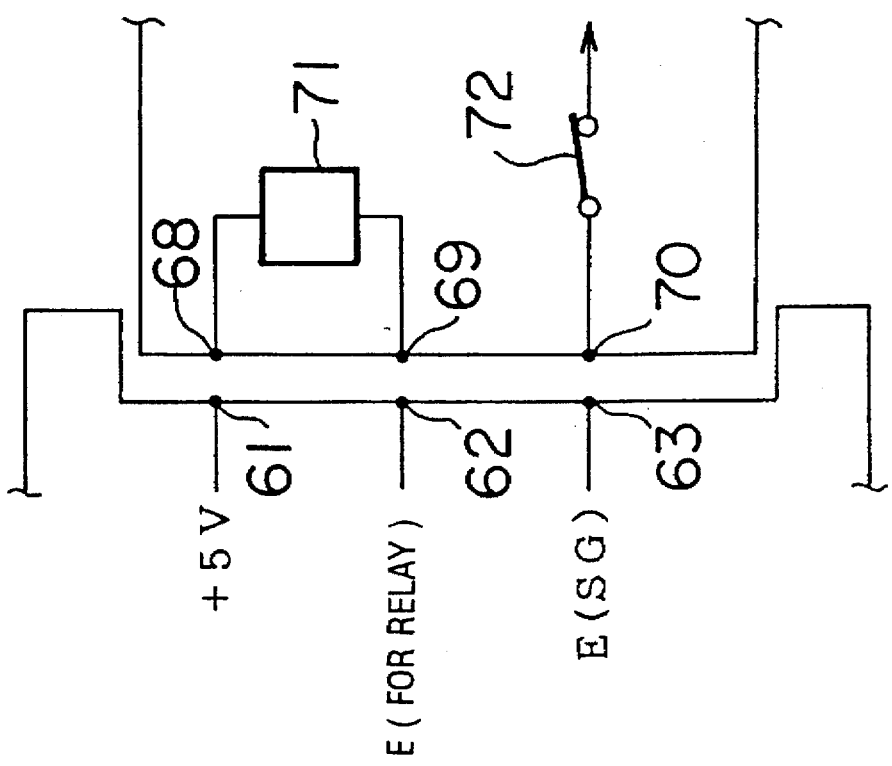
FIG. 11(A) is a view showing a first combination of a slot and a package in a ninth embodiment, showing a case where a package of a type such that the grounding sides are not separated from each other is mounted in a slot of a type such that the grounding sides are not separated from each other.
FIG. 11(B) is a view showing a first combination of a slot and a package in the ninth embodiment, showing a case where a package of a type such that the grounding sides are not separated from each other is mounted in a slot of a type such that the grounding sides are separated from each other.
Figure 11:
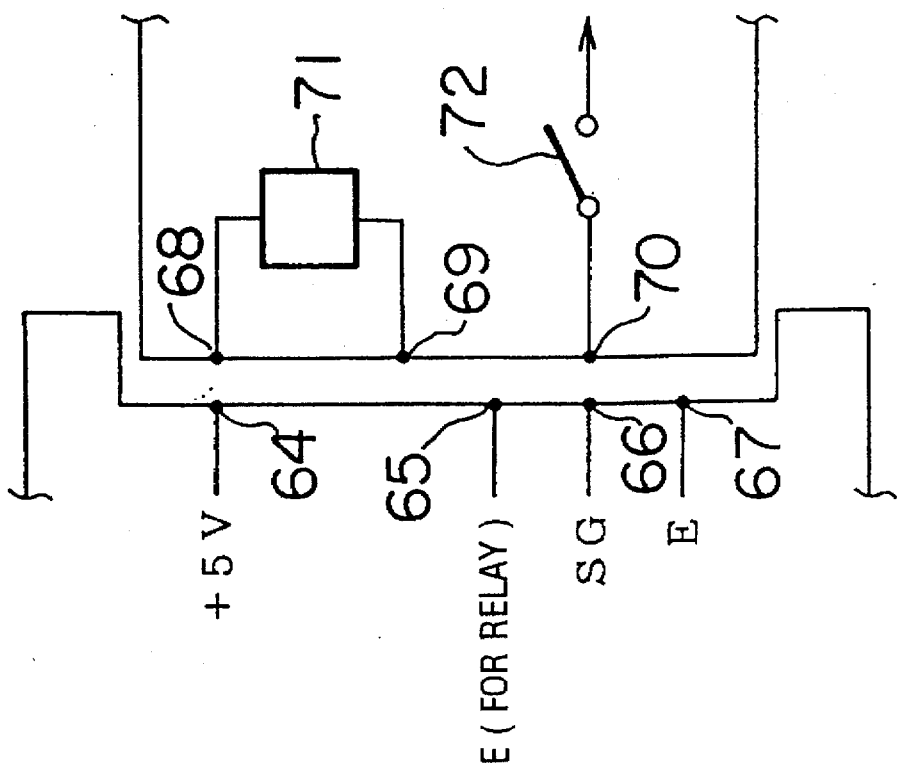

For the type such that the grounding sides of two power supply systems are not separated from each other, the slot on the shelf side to which a package is mounted has power supply terminals 61 and 62 for relay and a common grounding terminal 63, which are arranged at predetermined positions, as shown at the left in FIG. 11(A) and FIG. 12(C). The power supply terminals 61 and 62 for relay supply the power for driving relay from the shelf side to the package side. The common grounding terminal 63 is a common grounding terminal in the case where two power supply systems of −48 V and +5 V are supplied to the package. The terminals on the counter-grounding side, which supply two power supply systems of −48 V and +5 V to the package, is not shown in FIG. 11(A) and FIG. 12(C).

For the type such that the grounding sides of two power supply systems are separated from each other, the slot on the shelf side to which a package is mounted has power supply terminals 64 and 65, a −48 V system grounding terminal (SG) 66, and a +5 V system grounding terminal (E) 67, which are arranged at predetermined positions, as shown at the left in FIG. 11(B) and FIG. 12(D). The power supply terminals 64 and 65 for relay supply the power for driving relay from the shelf side to the package side. The terminal 64 is located at the same position as the terminal 61, while the terminal 65 is located at a position different from the terminal 62. The terminal 66 is located at the same position as the terminal 63, while the terminal 67 is located at a position different from the terminal 63. The −48 V system grounding terminal 66 is a grounding terminal in the case where the −48 V power supply system is supplied to the package, and the +5 V system grounding terminal 67 is a grounding terminal in the case where the +5 V power supply system is supplied. The terminals on the counter-grounding side, which supply two power supply systems of −48 V and +5 V to the package, is not shown in FIG. 11(B) and FIG. 12(D).

For the type such that the grounding sides of two power supply systems are not separated from each other, the package has power supply terminals 68 and 69 for driving relay and a common grounding terminal 70, which are arranged at predetermined positions, as shown at the right in FIGS. 11(A) and 11(B). To the power supply terminals 68 and 69 for driving relay are connected a relay driver 71 for driving relay, and to the common grounding terminal 70 is connected, via a relay 72, the common grounding side of the circuit requiring two power supply systems of −48 V and +5 V in the package. The relay 72 is driven by the relay driver 71. The terminal 68 is located at a position connectable to the terminals 61 and 64, the terminal 69 is at a position connectable to the terminal 62, and the terminal 70 is at a position connectable to the terminals 63 and 66. The terminals on the counter-grounding side, which is to be installed on the package for receiving two power supply systems of −48 V and +5 V from the shelf side, is not shown in FIGS. 11(A) and 11(B).

Figure 12:
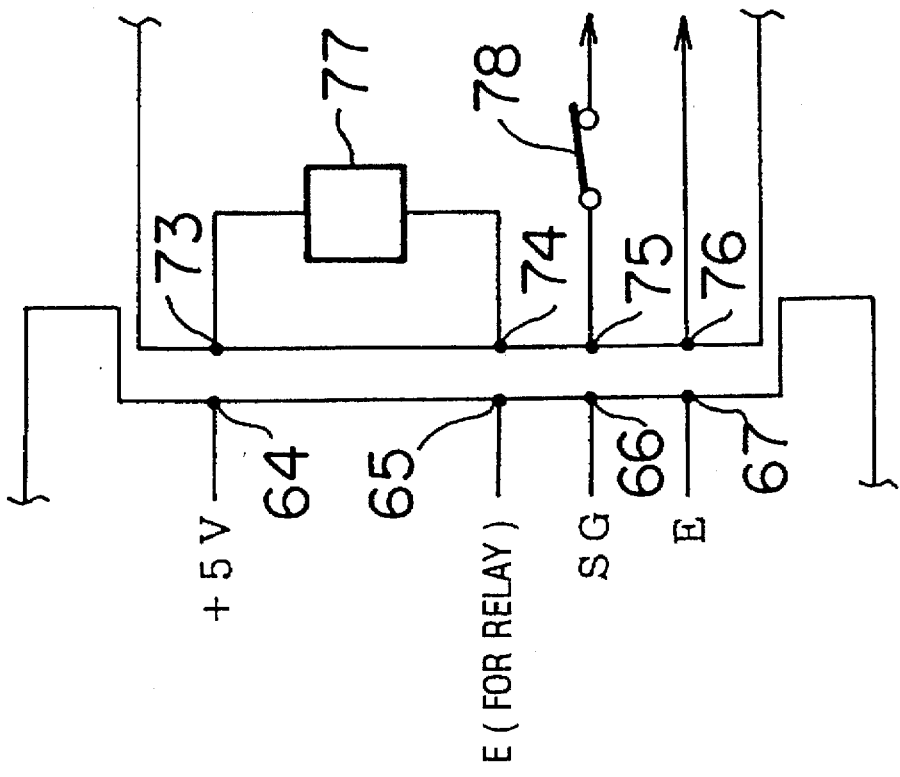
FIG. 12(C) is a view showing a second combination of a slot and a package in the ninth embodiment, showing a case where a package of a type such that the grounding sides are separated from each other is mounted in a slot of a type such that the grounding sides are not separated from each other.
FIG. 12(D) is a view showing a second combination of a slot and a package in the ninth embodiment, showing a case where a package of a type such that the grounding sides are separated from each other is mounted in a slot of a type such that the grounding sides are separated from each other.
Figure 12:
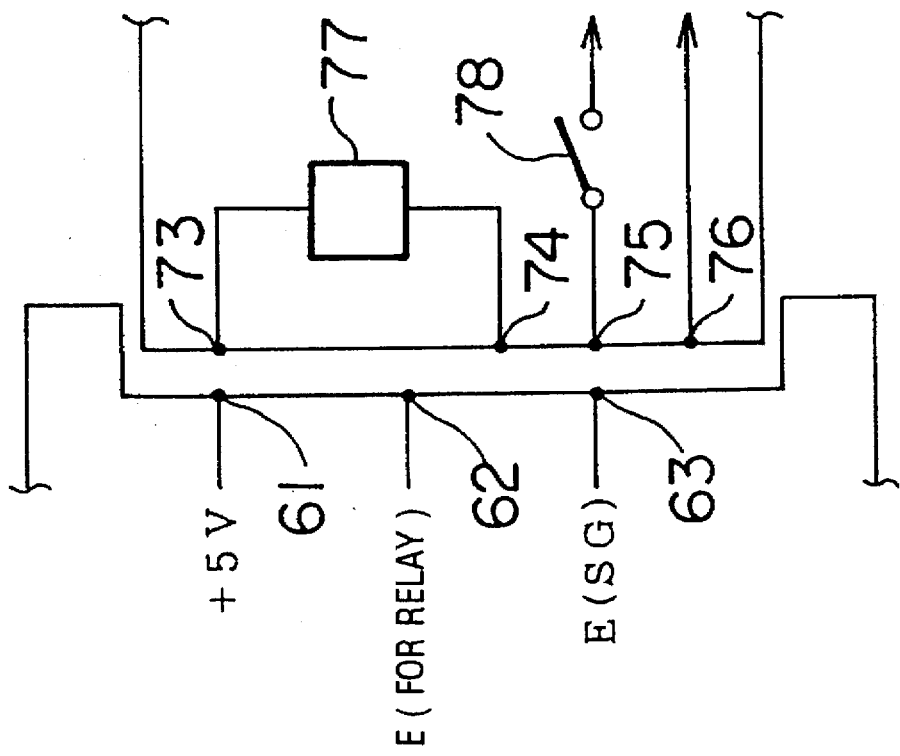
Figure 13:
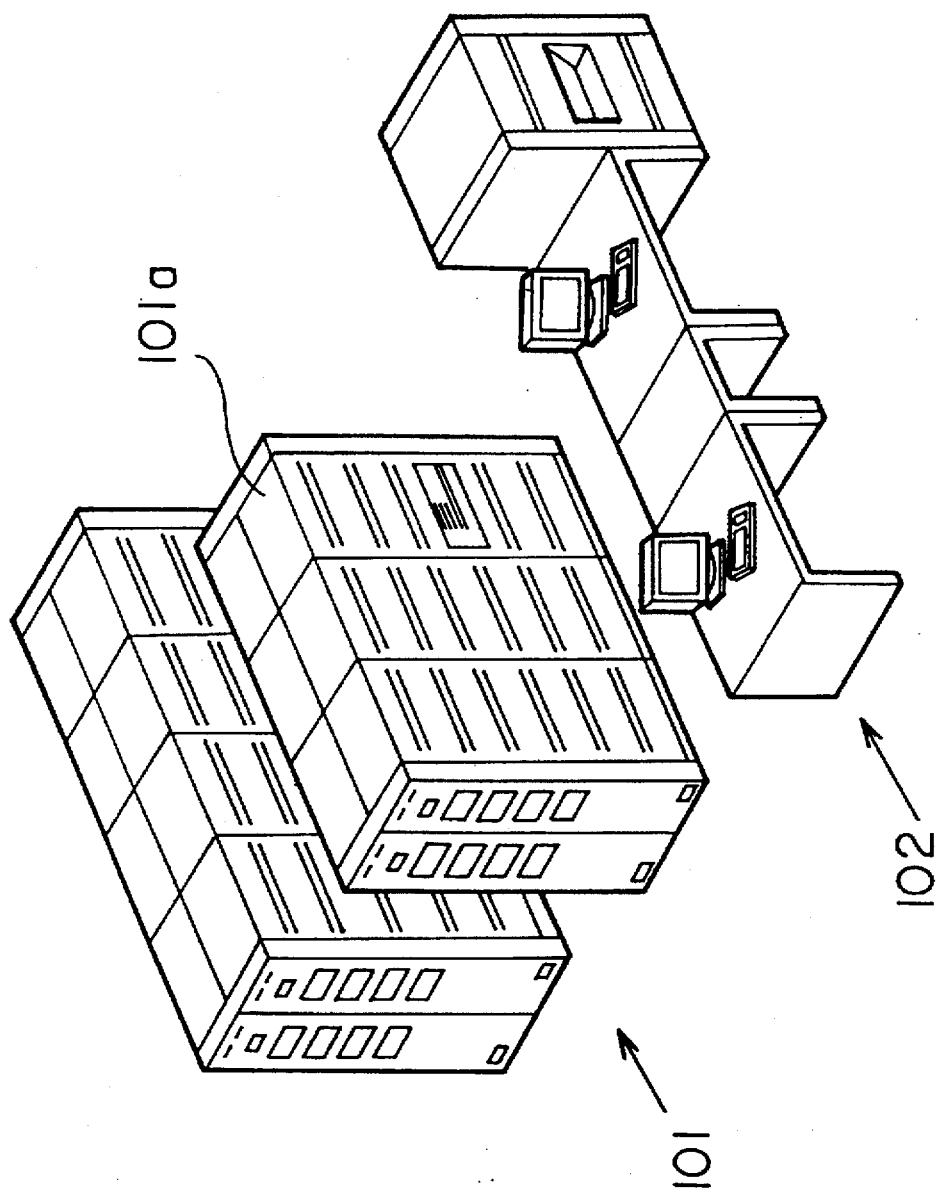
FIG. 13 is a view showing an appearance of a telephone exchange.
Figure 14:
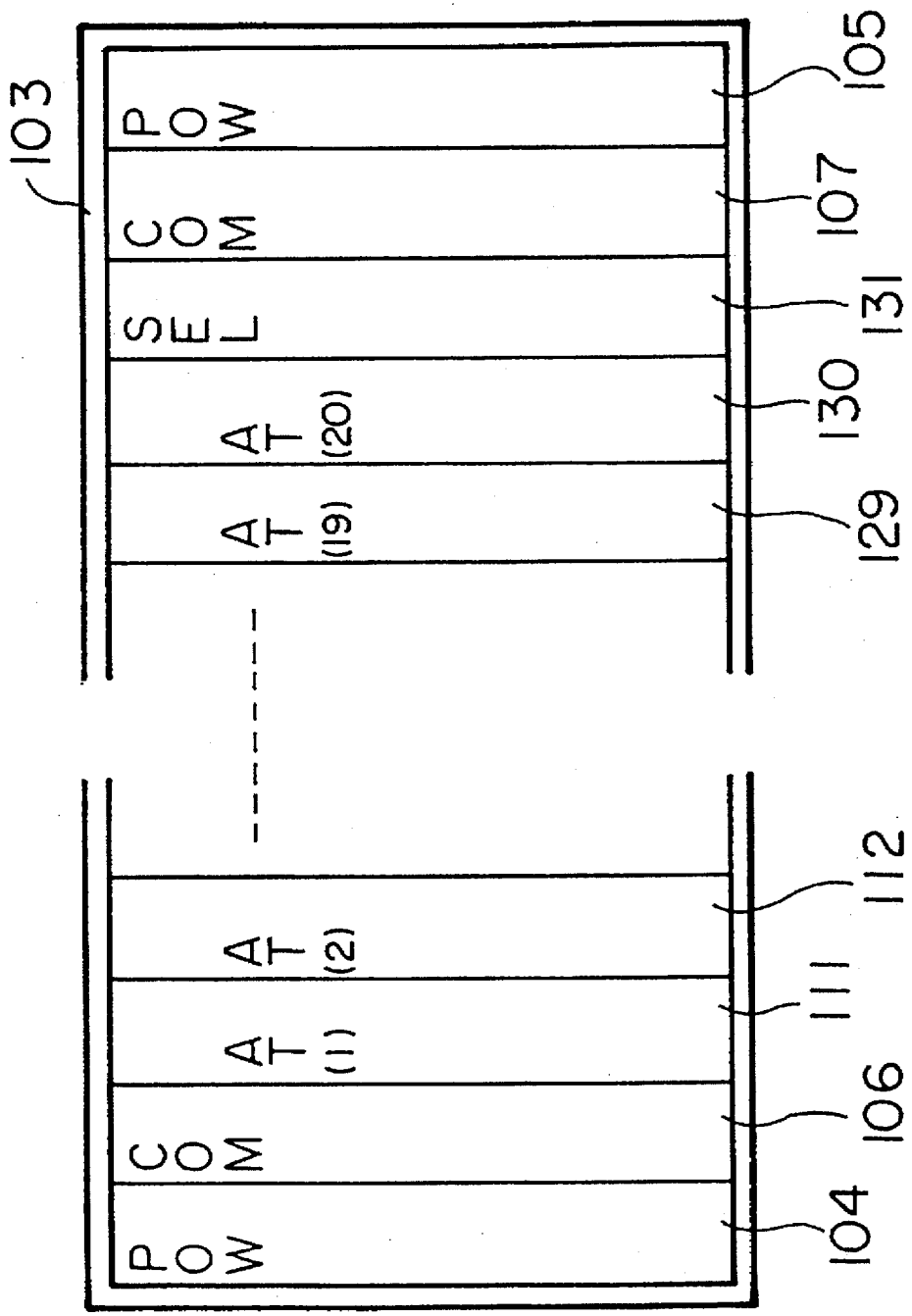
FIG. 14 is a view showing a configuration of a conventional analog trunk shelf.
Figure 15:
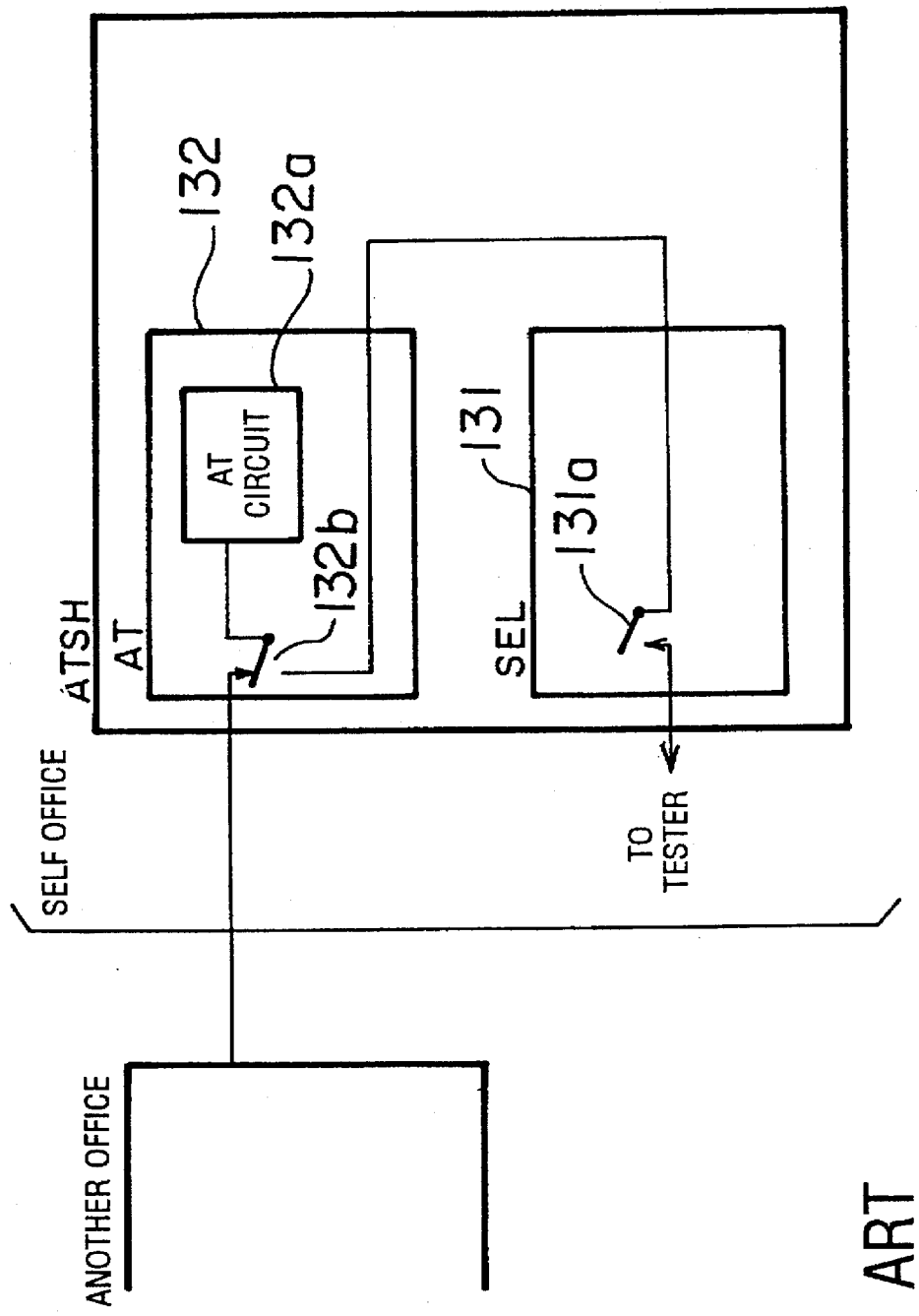
FIG. 15 is a view showing a connection of an interoffice communication AT section via a selector for operation test.

For the type such that the grounding sides of two power supply systems are separated from each other, the package has power supply terminals 73 and 74, a −48 V system grounding terminal (SG) 75, and a +5 V system grounding terminal (E) 76, which are arranged at predetermined positions, as shown at the right in FIGS. 12(C) and 12(D). To the power supply terminals 73 and 74 for driving relay are connected a relay driver 77 for driving relay, and to the −48 V system grounding terminal 75 is connected, via a relay 78, the grounding side of the circuit requiring the −48 V power supply system in the package. The relay 78 is driven by the relay driver 77. To the +5 V system grounding terminal 76 is connected the grounding side of the circuit requiring the +5 V power supply system in the package. The terminal 73 is located at a position connectable to the terminals 61 and 64, the terminal 74 is at a position connectable to the terminal 65, the terminal 75 is at a position connectable to the terminals 63 and 66, and the terminal 76 is at a position connectable to the terminal 67. The terminals on the counter-grounding side, which is to be installed on the package for receiving two power supply systems of −48 V and +5 V from the shelf side, is not shown in FIG. 12(C) and 12 (D).

Four combinations of connections between the slots of the shelf and the packages, which are configured as described above, will be described with reference to FIGS. 11(A), 11(B), 12(C) and 12(D).

FIG. 11(A) shows a case where a package of a type such that the grounding sides are not separated from each other is mounted in a slot of a type such that the grounding sides of two power supply systems are not separated from each other. In this case, current flows in the relay driver 71, so that the relay 72 is closed. Therefore, the grounding side of the circuit in the package is connected to the common grounding terminal 63 of the shelf. That is to say, since the slot and the package have the same power supply system, the connection between the slot and the package does not pose any problem, power being supplied to the package.

FIG. 11(B) shows a case where a package of a type such that the grounding sides are not separated from each other is mounted in a slot of a type such that the grounding sides of two power supply systems are separated from each other. In this case, current does not flow in the relay driver 71, so that the relay 72 is kept open. Therefore, power is not supplied to the circuit in the package. That is to say, since the slot and the package have a different power supply system, the supply of power from the shelf side to the circuit in the package is prevented.

FIG. 12(C) shows a case where a package of a type such that the grounding sides are separated from each other is mounted in a slot of a type such that the grounding sides of two power supply systems are not separated from each other. In this case, current does not flow in the relay driver 77, so that the relay 78 is kept open. Therefore, power is not supplied to the circuit of −48 V power supply system in the package. Power is not supplied to the circuit of +5 V power supply system because there is no terminal on the slot side. Thus, since the slot and the package have a different power supply system, the supply of power from the shelf side to the circuit in the package is prevented.

FIG. 12(D) shows a case where a package of a type such that the grounding sides are separated from each other is mounted in a slot of a type such that the grounding sides of two power supply systems are separated from each other. In this case, current flows in the relay driver 77, so that the relay 78 is closed. Therefore, the grounding side of the circuit of −48 V system in the package is connected to the grounding terminal 66 of −48 V system of the shelf. Also, the grounding side of the circuit of +5 V system in the package is connected to the grounding terminal 67 of +5 V system via the terminal 76. Thus, since the slot and the package have the same power supply system, the connection between the slot and the package does not pose any problem, power being supplied to the package.

Thereupon, wrong connection of power supply systems is prevented, so that a trouble caused by the wrong connection can be avoided.

Although the +5 V power supply system is used as the power source for driving relay in the above ninth embodiment, the −48 V power supply system may be used for this purpose.

In the ninth embodiment, the relay 78 is installed between the grounding terminal 75 of −48 V system and the grounding side of the circuit requiring -48 V power supply system in the package. However, the apparatus may be configured so that a relay is installed between the grounding terminal 76 of +5 V system and the grounding side of the circuit requiring the +5 V power supply system in the package, the common grounding terminal 63 on the slot side is eliminated, and the common grounding terminal is installed at the slot position corresponding to the terminal 76.

As described above, in the present invention, the mounting state of a plurality of packages needed for achieving a predetermined function is displayed, so that all necessary packages can be mounted surely, and the mounting of unnecessary packages can be prevented. Therefore, the cost can be reduced because unnecessary packages are not mounted, and the complaint about missing packages can be avoided. Also, AT sections which cannot be used can be displayed at the time of selector change. Further, when a trouble occurs, the section causing the trouble can be isolated.

Since a relay is installed halfway in the power supply line so that the drive of the relay is changed in accordance with the matching and mismatching of the power supply systems, wrong connection of power supply systems can be prevented by the addition of a small number of parts, so that the occurrence of trouble caused by wrong connection can surely be avoided.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An apparatus for assisting mounting of separately detachable packages to a shelf, comprising:
    first display means for showing that at least one of a plurality of separately mountable packages which need each other to achieve a predetermined function is mounted to the shelf; and second display means for showing that all of said plurality of separately mountable packages are mounted to the shelf.

2. An apparatus for assisting mounting of various separately detachable packages of electronic equipment, which achieves a variety of functions by mounting the packages to a shelf, comprising:
    a particular package;
    a plurality of separately mountable packages, each of which achieves a predetermined function by being combined with said particular package;
    a first resistor, provided in said particular package, a first terminal of said first resister connected to one polarity of a power source;
    second resistors, respectively provided in said plurality of packages, a first terminal of each of said second resistors being connected to the other polarity of said power source;
    a conduction line to which a second terminal of said first resistor provided in said particular package and second terminals of respective second resistors provided in said plurality of packages are connected when said particular package and said plurality of packages are mounted to the shelf;
    judging means, connected to said conduction line, for judging whether at least one of said plurality of packages is mounted to the shelf on the basis of the voltage value of said conduction line; and
    display means for displaying the judgment result of said judging means.

3. An apparatus for assisting mounting of various separately detachable packages of electronic equipment, which achieves a variety of functions by mounting the packages to a shelf, comprising:
    a particular package;
    a plurality of separately mountable packages, each of which achieves a predetermined function by being combined with said particular package;
    a first resistor, provided in said particular package, a first terminal of said first resister connected to one polarity of a power source;
    second resistors, respectively provided in said plurality of packages, a first terminal of each of said second resistors being connected to the other polarity of said power source;
    a first conduction line to which a second terminal of said first resistor provided in said particular package is connected when said particular package is mounted to the shelf;
    a second conduction line to which second terminals of said second resistors provided in said plurality of packages are connected when each of said plurality of packages is mounted to the shelf;
    judging means, connected to said first and second conduction lines, for judging whether at least one of said plurality of packages is mounted to the shelf on the basis of voltage values of said conduction lines; and
    display means for displaying the judgment result of said judging means.

4. An apparatus assisting mounting of various separately detachable packages of electronic equipment, which achieves a variety of functions by mounting the packages to a shelf, comprising:
    a particular package;
    a plurality of separately mountable packages, each of which achieves a predetermined function by being combined with said particular package;
    a resistor, provided in each of said plurality of packages, a first terminal of which is connected to one polarity of a power source;
    a conduction line to which a second terminal of each resistor provided in each of said plurality of packages is connected when each of said plurality of packages is mounted to the shelf;
    judging means, connected to said first and second conduction lines, for judging whether at least one of said plurality of packages is mounted to the shelf on the basis of the voltage value of said conduction lines; and
    display means for displaying the judgment result of said judging means.

5. An apparatus assisting mounting of various separately detachable packages of electronic equipment, which achieves a variety of functions by mounting the packages to a shelf, comprising:
    two separately mountable packages which need each other to achieve a predetermined function;
    a resistor, provided in each of said two packages, a first terminal of each resistor being connected to one polarity of a power source;

two conduction lines to which a second terminal of each of said resistors is connected, respectively, when each of said two packages is mounted to the shelf; and judging and display means, provided in each of said two packages, and connected to each of said two conduction lines, for judging whether the package to which the corresponding resistor is installed is mounted to the shelf, and for displaying the judgment result.

6. An apparatus for assisting mounting of various separately detachable packages in electronic equipment, which achieves a variety of functions by mounting the packages to a shelf, comprising:

a shelf including a plurality of connecting portions to which various separately mountable packages are mounted;

a first connecting portion of said plurality of connecting portions, having two power supply systems, grounding sides of these power supply systems being separated from each other;

a second connecting portion of said plurality of connecting portions, having two power supply systems, grounding sides of these power supply systems not being separated from each other;

a first package, having two power supply systems, grounding sides of these power supply systems being separated from each other;

a second package, having two power supply systems, grounding sides of these power supply systems not being separated from each other;

a first power supply terminal of said first connecting portion for relay, provided at a predetermined first position;

a second power supply terminal of said second connecting portion for relay, provided at a predetermined second position different from said predetermined first position;

a first relay driver, provided in said first package and having a connecting terminal at a position connectable to said first power supply terminal for relay;

a first grounding line, provided in said first package and connectable to either of two grounding sides of two power supply systems of said first connecting portion;

a first relay, provided in said first package and driven by said first relay driver;

a second relay driver, provided in said second package and having a connecting terminal at a position connectable to said second power supply terminal for relay;

a second ground line, provided in said second package and connectable to common grounding side of two power supply systems of said second connecting portion; and a second relay, provided in said second package and driven by said second relay driver.

\* \* \* \* \*